(12) United States Patent
Micheloni et al.

(10) Patent No.: US 6,456,530 B1
(45) Date of Patent: Sep. 24, 2002

(54) NONVOLATILE MEMORY DEVICE WITH HIERARCHICAL SECTOR DECODING

(75) Inventors: Rino Micheloni, Turate; Matteo Zammattio, Milan; Giovanni Campardo, Bergamo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 60 days.

(21) Appl. No.: 09/602,680

(22) Filed: Jun. 26, 2000

(30) Foreign Application Priority Data

Jun. 24, 1999 (EP) .............................. 99830396

(51) Int. Cl.[7] .............................................. G11C 16/04
(52) U.S. Cl. ............................ 365/185.13; 365/185.18
(58) Field of Search ................... 365/185.11, 185.18, 365/185.27, 185.29, 185.33

(56) References Cited

U.S. PATENT DOCUMENTS

| | | | |
|---|---|---|---|
| 5,270,980 A | * 12/1993 | Pathak et al. | 365/185.11 |
| 5,640,123 A | 6/1997 | Akaogi et al. | 327/534 |
| 5,657,268 A | 8/1997 | Truong et al. | 365/185.02 |
| 5,774,399 A | 6/1998 | Kwon | 365/185.18 |
| 5,818,764 A | 10/1998 | Yiu et al. | 365/185.11 |
| 6,055,184 A | * 4/2000 | Acharya et al. | 365/185.11 |
| 6,125,058 A | * 9/2000 | Kuo et al. | 365/185.33 |
| 6,285,588 B1 | * 9/2001 | Fastow | 365/185.29 |

FOREIGN PATENT DOCUMENTS

| | | |
|---|---|---|
| EP | 0622806 A2 | 11/1994 |
| EP | 0640985 A2 | 3/1995 |

\* cited by examiner

*Primary Examiner*—Trong Phan
(74) *Attorney, Agent, or Firm*—Lisa K. Jorgenson; Brian L. Johnson; Seed IP Law Group, PLLC

(57) ABSTRACT

The memory device has hierarchical sector decoding. A plurality of groups of supply lines is provided, one for each sector row, extending parallel to the sector rows. A plurality of switching stages are each connected between a respective sector and a respective group of supply lines; the switching stages connected to sectors arranged on a same column are controlled by same control signals supplied on control lines extending parallel to the columns of sectors. For biasing the sectors, modification voltages are sent to at least one selected group of biasing lines, and control signals are sent to the switching stages connected to a selected sector column.

25 Claims, 10 Drawing Sheets

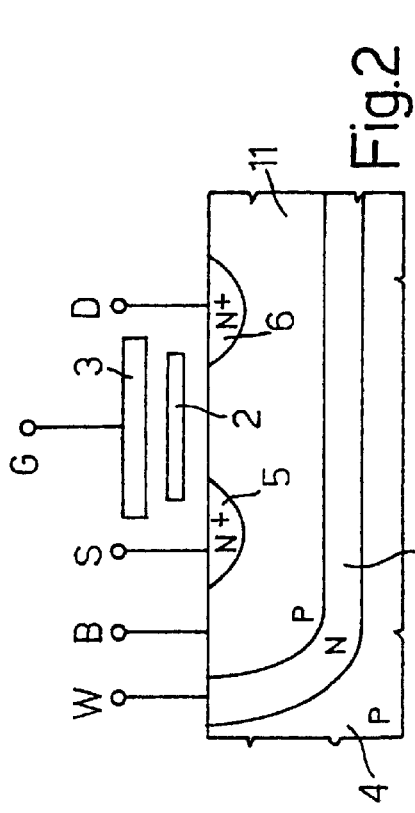
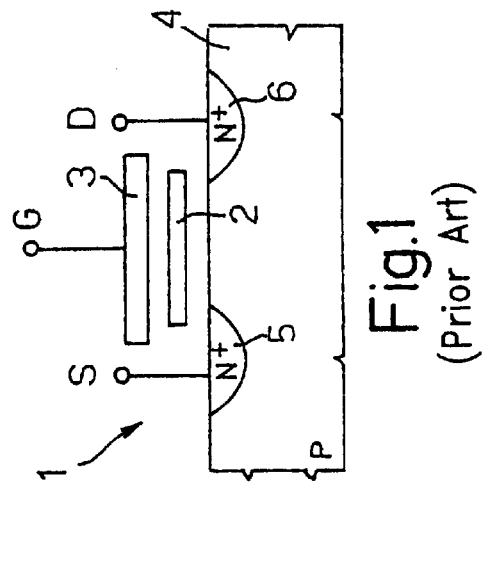
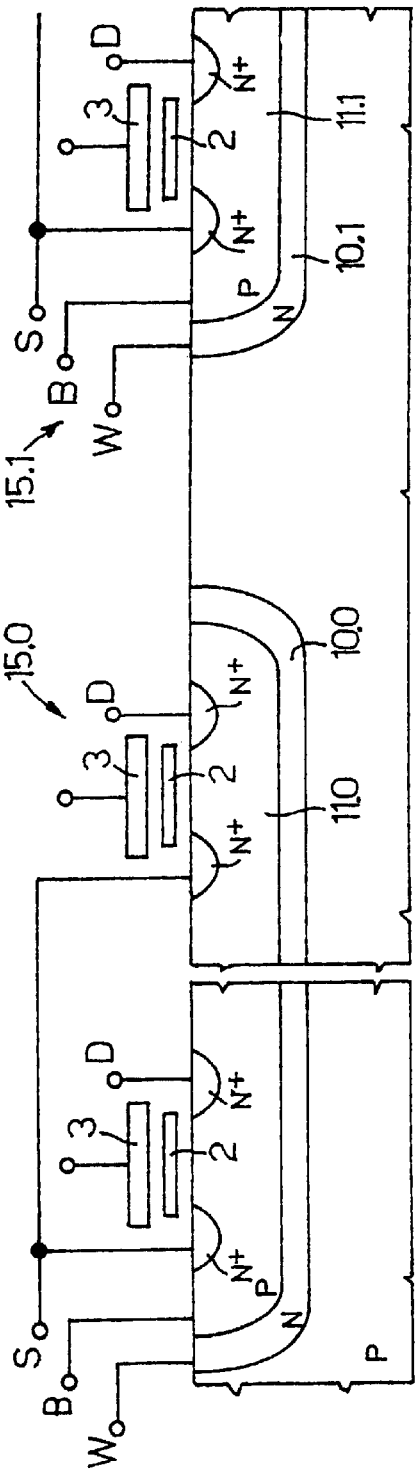

NONVOLATILE MEMORY DEVICE WITH HIERARCHICAL SECTOR DECODING

TECHNICAL FIELD

The present invention relates to a nonvolatile memory device, in particular of flash type.

BACKGROUND OF THE INVENTION

As is known, the increasing demand for high density memories has led to the design of nonvolatile memory structures having an increasingly compact architecture.

For this reason, nonvolatile memories that store information in binary format in floating gate memory cells are increasingly widespread. FIG. 1 shows, for example, the structure of a flash memory cell 1 which has a floating gate region 2 and a control gate region 3 overlying a P-type substrate 4, where an N-type source region 5 and an N-type drain region 6 are integrated. For storing information, electric charges are injected from the substrate 4 into the floating gate region 2 (programming operations), so varying the threshold of the memory cell, i.e., the voltage to be applied between the source region 5 and the control gate region 3 to obtain turning-on of the memory cell 1 and conduction of electric current between the source region 5 and the drain region 6. The read operation detects the conductive characteristic of the cells, converting it into information. The operation of removing electric charge stored in the floating gate region 2, referred to as "erasing", is carried out differently according to the memory type. In particular, in high compactness flash memories, the source regions of the cells of one part of the memory are connected together and are erased simultaneously by biasing the source region 5 and possibly also the substrate 4 with high positive voltages (typically, of between +5 and +8 V). The portions of memory in which the cells have source regions connected together are called "sectors".

FIG. 2 shows the structure of a memory cell 1 formed in a triple well. As may be noted, the P-type substrate 4 houses an N-type external well 10, which in turn houses a P-type isolated well 11 (constituting the body region), where the source region 5 and drain region 6 are housed. In FIG. 3, the memory cells 1 belonging to a same sector are all housed in the same isolated well 11, and the cells of two sectors 15.0 and 15.1 are housed in two separate isolated wells, 11.0 and 11.1, and two separate external wells, 10.0 and 10.1.

The division of the memory array into a number of sectors and the size of these sectors, which yields the resolution of the erasing operation, depend upon the specific needs of the applications. It is evident that the higher the memory density, the greater the likelihood of having to divide the array into a large number of sectors, which are each to be erased separately.

In flash memories of the multilevel type (in which each memory cell stores more than one bit), the information density per unit area grows further, just as the need to have sufficiently subdivided sectors.

The division into sectors is conditioned not only by the applications, but also by the process parameters (defectiveness and management of redundancy, as well as band-to-band tunneling current if the source region 5 and the isolated well 11 are at different erasing potentials).

For example, each sector may comprise between 1 and 2 Mb; in some applications, divisions into non-uniform sectors are necessary, and sectors of very small size are required (for example, 16 kb or 32 kb) to contain the bootstrap code of the microprocessor and the parameters for the bootstrap separately.

Inside a flash memory, regardless of how the sectors are organized (by rows or by columns), it is essential to bias the source regions, and possibly the isolated wells 11 of the cells, as well as the respective external wells 10, in an independent way. In addition, also during programming it may be advantageous to bias the isolated well 11 of the selected sector; in fact, by biasing the isolated well 11 at a negative potential (ranging between −1 and −2 V), it is possible to obtain better performance in terms of programming speed. For instance, a triple well flash cell, as shown in FIG. 2, can be biased in the way illustrated in the following Table I, using the body terminal B for the isolated well 11 and the N-well terminal W for the external well 10.

TABLE I

| OPERATION | S | B | W |
| --- | --- | --- | --- |
| Reading | 0 V | 0 V | VCC |
| Programming | 0 V | −1/−2 V | VCC |
| Erasing | 5–8 V | 5–8 V | 5–8 V |

It is therefore of fundamental importance to control each sector independently of the others to prevent undesired electrical stresses on the source terminal ("source stress" or "soft erasing").

In case of large size memory arrays, this involves a considerable complexity for controlling the sectors. In fact, for each sector it is necessary to provide MOS switches to connect it to the high voltage during erasing, to connect its terminals to ground during reading, and to bias the isolated well 11 at a negative voltage during programming. For example, in case of a 64 Mb flash memory divided into 64 equal sectors of 1 Mb each, if each sector has an own enabling signal and own signals for managing the operation being carried out (programming, reading, erasing, erasing and programming verify), the following signals and switches are necessary (see in particular FIG. 4):

- 64 sector enabling signals S-EN, one for each sector, to be decoded starting from the address vector defining them uniquely and to be supplied to a respective sector switch. Since the memory cells are arranged in a matrix (i.e., in rows and columns), the sector enabling signals must traverse areas adjacent to the rows and columns of the memory banks;
- at least two control signals CS, one for erasing, which controls the positive erasing biasing, and one for programming, which controls the negative biasing of the isolated well 11. Both inactive signals could represent the read condition (source terminal S and body terminal B to ground);
- sector switches (formed by enabling transistors or pass transistors of the PMOS and NMOS types), both positive and negative, for biasing the source terminal S, the body terminal B and the N-type well W of each sector;
- a control logic for each sector, which decodes the signals to be applied to the sector switches according to the operating mode;
- high voltage analog switches, which enable the sector switches (both PMOS and NMOS) to be turned off in presence of voltages having a higher value than the supply voltage. In fact, as is known, positive voltages greater than the supply voltage are advantageously transferred by PMOS transistors, and negative voltages are advantageously transferred by NMOS transistors.

In FIG. 4, the sector switches PT, the control logic LOGIC, and the analog high voltage switches HVS of each sector are gathered together in a single block 16 for simplicity.

FIGS. 5 and 6 show, respectively, possible implementations of high voltage analog switches of positive and negative type wherein IN represents the input signal, O and ON represent the output signal and its inverted signal, respectively; $V_{dd}$ is the supply voltage; $V_{pp}$ is a positive voltage higher than the supply voltage, for example the programming voltage; and $V_{NEG}$ is a negative voltage, for example the body voltage during programming.

It is evident that this organization requires a high use of the area necessary, above all, for arranging the interconnections of the enabling signals and the high voltage switches HVS.

Even if the biasing terminals of the sectors were brought to another point of the memory device and the decoding control logic circuits were grouped together there, a considerable space would be required to implement the signal buses. In addition, these buses could not be managed with metal lines of minimal width, in that the current flowing during charging and discharging of the terminals is a few mA.

In the example cited above of 64 sectors with three terminals, i.e., one body terminal, one N-well terminal, and one source terminal, for each sector three P-channel pass transistors (and corresponding positive switches) should be implemented to bring onto each terminal the high positive voltage required for erasing, and an N-channel pass transistor (and corresponding negative switch) for the negative body voltage. Consequently, 256 switching circuits would be required, which would occupy a large amount of space given that each one of them requires from 6 to 10 MOS transistors.

SUMMARY OF THE INVENTION

An embodiment of the invention provides an architecture enabling biasing of the sectors with a smaller area bulk.

An embodiment of the present invention is directed to a memory device that includes a plurality of memory sectors, a plurality of switching stages, a plurality of groups of biasing lines, and a plurality of decoding stages, one for each of the first alignment lines. Each memory sector includes a plurality of memory cells and the memory sectors are mutually aligned along a plurality of first alignment lines parallel to one another and along a plurality of second alignment lines parallel to one another and perpendicular to the first alignment lines. Each switching stage is connected to a respective one of the memory sectors. The groups of biasing lines extend parallel to the first alignment lines and each group of biasing lines is connected by a respective set of the switching stages to the memory sectors aligned along a respective one of the first alignment lines. The decoding stages are connected between reference potential lines and a respective one of the groups of biasing lines. Such an arrangement implements a hierarchical decoding of the memory sectors.

In practice, the memory device enables selecting the sectors in a unique way, using high voltage pass lines and enabling signals appropriately shared by rows and columns of sectors, for example, by getting the rows of sectors to share the high voltage lines, and the columns of sectors to share the enabling signals.

BRIEF DESCRIPTION OF THE DRAWINGS

For a better understanding the present invention, a preferred embodiment thereof is now described, purely to provide a non-limiting example, with reference to the attached drawings, wherein:

FIG. 1 shows the structure of a flash type memory cell formed in a substrate;

FIG. 2 shows the structure of a flash type memory cell formed in triple well;

FIG. 3 shows the implementation of two different sectors formed in the triple well;

DETAILED DESCRIPTION OF THE INVENTION

Figure 4:
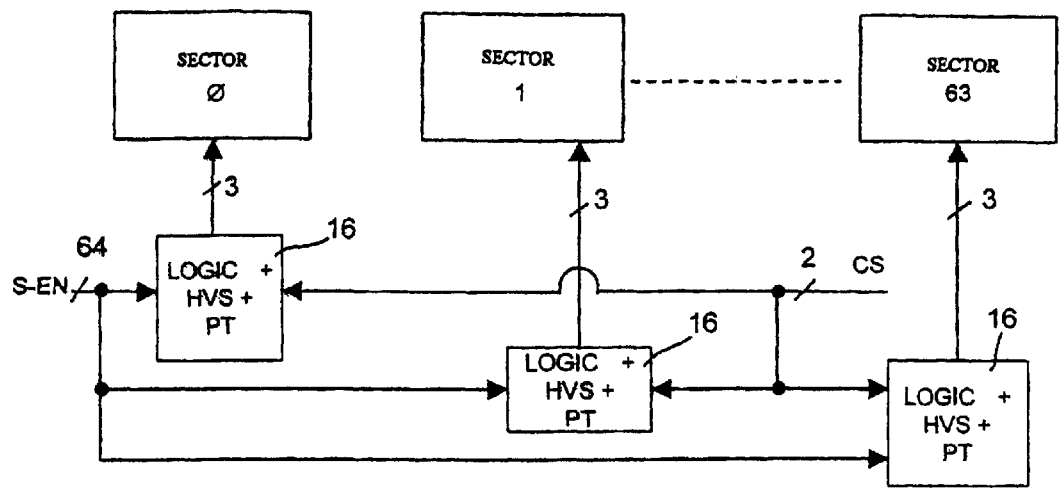
FIG. 4 presents the organization of a memory device of a known type.
Figure 7:
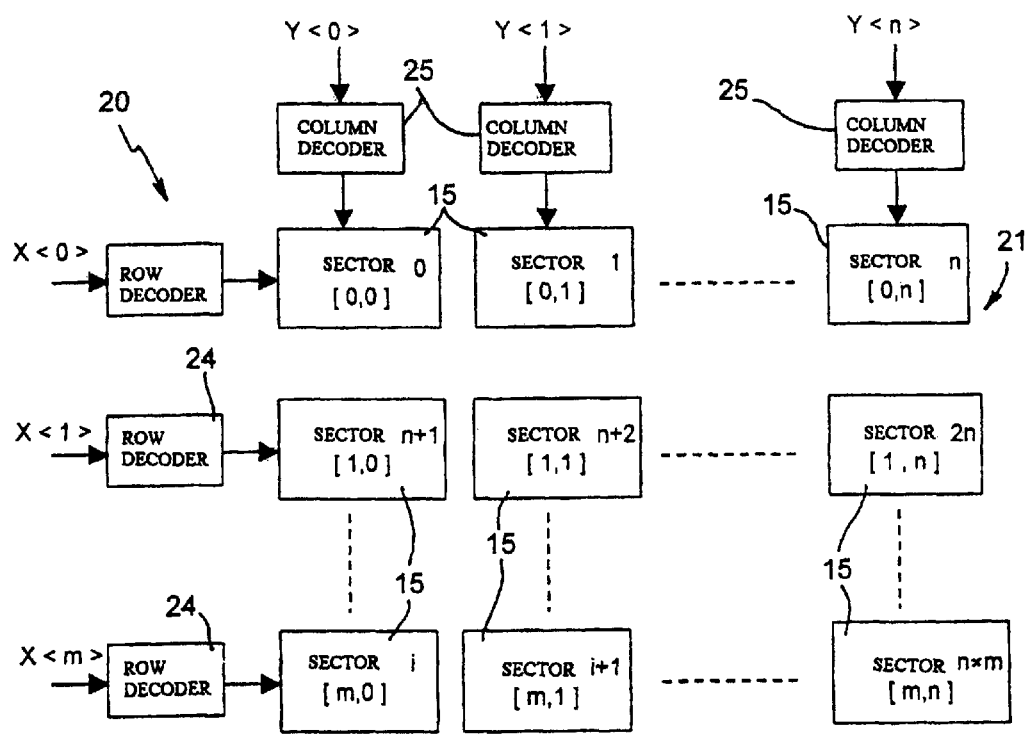
FIG. 7 shows the architecture according to an embodiment of the present invention.
Figure 7A:
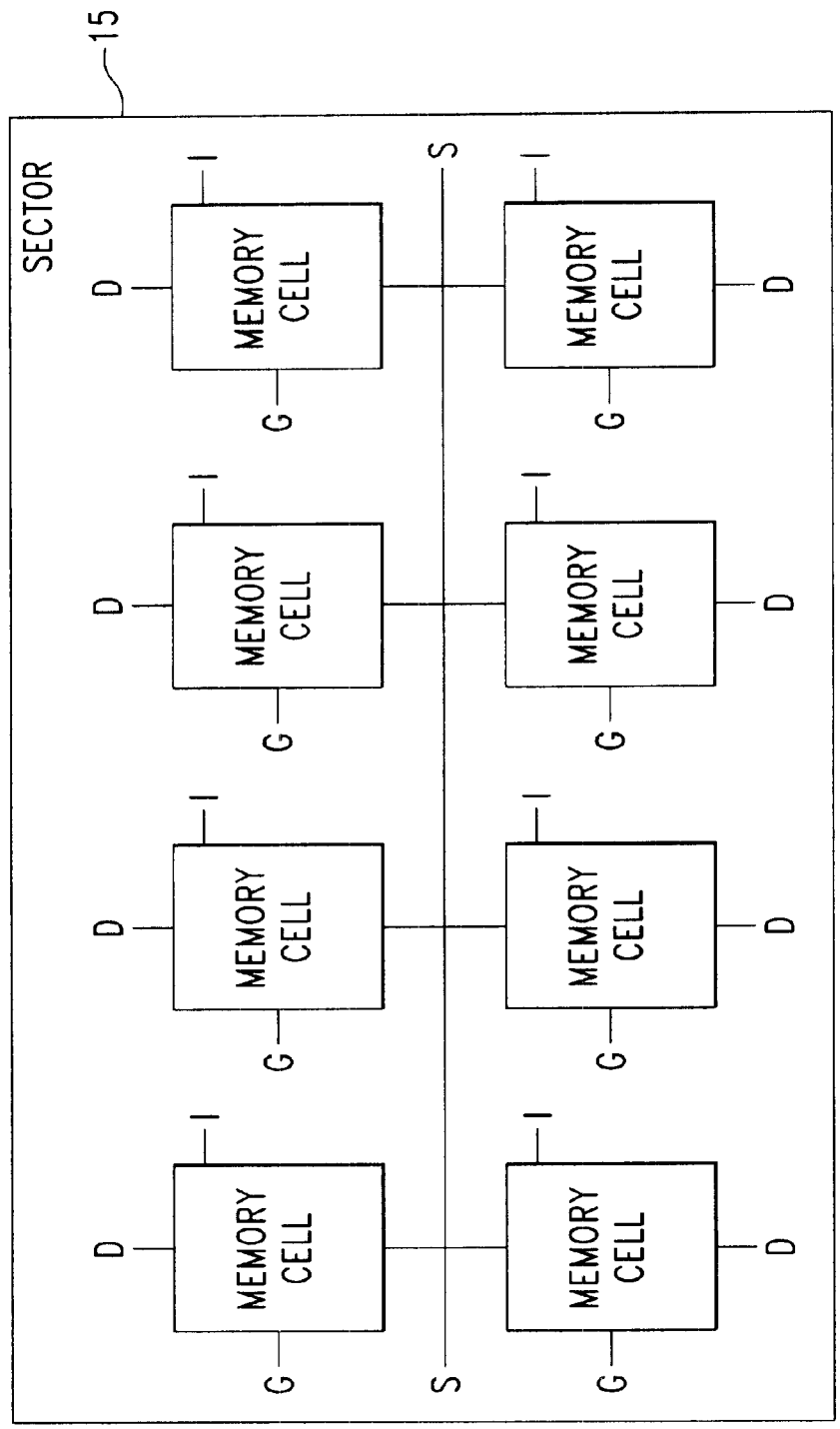

FIG. 7 shows a memory device 20 comprising a memory array 21 formed by a plurality of sectors 15 arranged in rows and columns of sectors. Each sector 15 comprises a group of memory cells 1 physically arranged adjacent to one another and having a common terminal (in the embodiment shown, the source terminal (FIG. 7A). In addition, the memory cells are made in a triple well structure and each sector has an own isolated well region 11 and an own isolated well region 10, as shown in FIG. 3). In FIG. 7 the position of each sector 15 is identified by the row and by the column to which the sector 15 belongs. A row decoder 24 is associated with each sector row, and a column decoder 25 associated with each sector column. Each row decoder 24 receives a respective sector row enabling signal X<0>, X<1>, . . . , X<m>, and each column decoder 25 receives a respective sector column enabling signal Y<0>, Y<1>, . . . , Y<n>.

In practice, sector row enabling signal X<0> enables the row decoder 24 connected to sectors 0-n (first sector row); sector row enabling signal X<1> enables the row decoder 24 connected to sectors (n+1)–2n, . . . (second sector row); sector column enabling signal Y<0> enables the column decoder 25 connected to sectors 0, (n+1), . . . ; sector column enabling signal Y<1> enables the column decoder 25 connected to sectors 1, (n+2), . . . , (first sector column), and so forth, so that decoding of sector row and column enabling signals X and Y is sufficient to identify a given sector uniquely.

The operations of modifying a selected sector (erasing and programming) require the application of voltages different from the supply voltage and from the ground level to the terminals of the selected sector. These modification voltages may be supplied through biasing lines arranged parallel to first alignment lines, for example, to sector rows. Appropriate high voltage switches supply the high voltage only to the selected sector row. In practice, the sector row enabling signals X activate the high voltage switches. In this case, the sector column enabling signals Y may be used to activate the pass transistors between the high voltage line and the respective selected sector column, or else, the pass transistors connected to the sectors aligned along a second selected alignment line. In this way, only the sector that has the horizontal biasing line actually biased at the modification levels will be able to be written or erased. Obviously, also dual implementation is possible, whereby the sector column enabling signals supply the high voltage to the selected sector column and the sector row enabling signals determine biasing of the selected sector.

In practice, a hierarchical sector decoding is obtained.

A specific example of selection of a sector 15 with the hierarchical sector decoding described above in reading, erasing and programming modes will now be described with reference to FIGS. 8–10 for the simplified case in which the memory array 21 comprises only four sectors 15.0, 15.1, 15.2, and 15.3, arranged in two sector rows and two sector columns.

Figure 8:
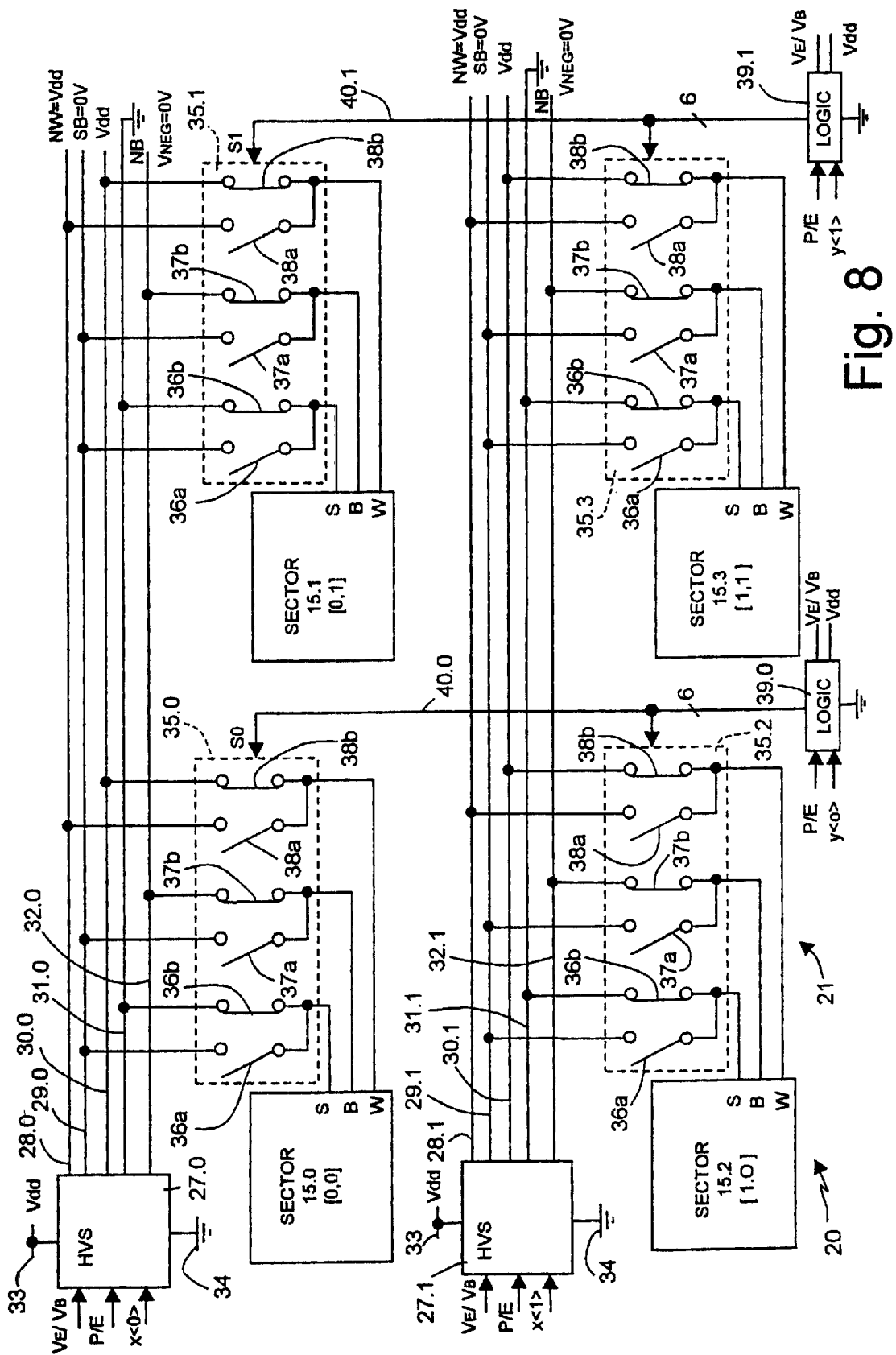
FIGS. 8–10 show in greater detail part of the architecture of FIG. 7 in three different operating conditions.

With reference to FIG. 8, for each sector row, a high voltage switch stage (HVS stages 27.0 and 27.1) is provided, which receives modification voltages $V_E$, $V_B$, necessary during erasing and programming; a two-bit mode signal P/E, which specifies the operation to be carried out; and an addressing signal X<0> and, respectively, X<1>. Each HVS stage 27.0, 27.1, which is moreover connected to an input supply line 33 at $V_{dd}$ and to a ground line 34, has five outputs connected to as many biasing lines 28.0–32.0, respectively 28.1–32.1 (hereinafter also indicated simply as biasing lines 28-32, where it is not necessary to specify the associated sector row). In detail, on NW lines 28, for positive modification of N-type wells, a voltage NW is supplied; on SB line 29, for positive modification of source and body, a voltage SB is supplied; on sector supply lines 30 the supply voltage $V_{dd}$ is supplied; the ground lines 31 are set at 0 V; and on NB lines 32, for negative modification of body, a voltage $V_{NEG}$ is supplied.

Each sector 15.0–15.3, of which only the source biasing terminal S, the body biasing terminal B, and the isolated well biasing terminal W are shown, is connected to the biasing lines 28–32 through a respective sector switching stage 35.0–35.3 comprising three pairs of complementary switches 36a, 36b; 37a, 37b; 38a, 38b, made up of pass transistors as discussed hereinafter. In detail, in all sector switching stages 35.0–35.3, the switch 36a is connected between the respective source terminal S and the respective SB line 29; the switch 36b is connected between the respective source terminal S and the respective ground line 31; the switch 37a is connected between the respective body terminal B and the respective SB line 29; the switch 37b is connected between the respective body terminal B and the respective NB line 32; the switch 38a is connected between the respective N-well terminal W and the respective NW line 28; and the switch 38b is connected between the respective N-well terminal W and the respective sector supply line 30. The sector switching stages 35.0–35.3 are made topologically near the respective sector 15.0–15.3.

The pairs of complementary switches 36a, 36b; 37a, 37b; 38a, 38b receive respective commands from logic control stages 39.0 and 39.1 common for the sector columns. In detail, the logic control stage 39.0 sends control signals S0 to the sector switches 35.0 and 35.2 corresponding to sectors 15.0 and 15.2 with address Y<0>, and the control logic stage 39.1 sends control signals S1 to the sector switching stages 35.1 and 35.3 corresponding to sectors 15.1 and 15.3 with address Y<1>. The control signals S0, S1 sent on six lines 40.0, 40,1 for each control logic stage 39.0, 39.1 supply complementary pairs of signals, so that the switches 36a, 37a and 38a always receive signals that are complementary to the switches 36b, 37b and 38b, and are therefore closed alternately to the latter switches.

The control logic stages 39.0, 39.1 receive sector column address signals Y<0> and, respectively, Y<1>, the mode signal P/E, and the modification voltages $V_E$ and $V_B$ (supplied also to the HVS stages 27.0 and 27.1) and are connected to the input supply line 33 at $V_{dd}$ and the ground line 34, so that the control signals S0 and S1 sent to the sector switching stages 35.0–35.3 have voltage levels corresponding to the voltages present on the biasing lines 28–32.

Figure 6:
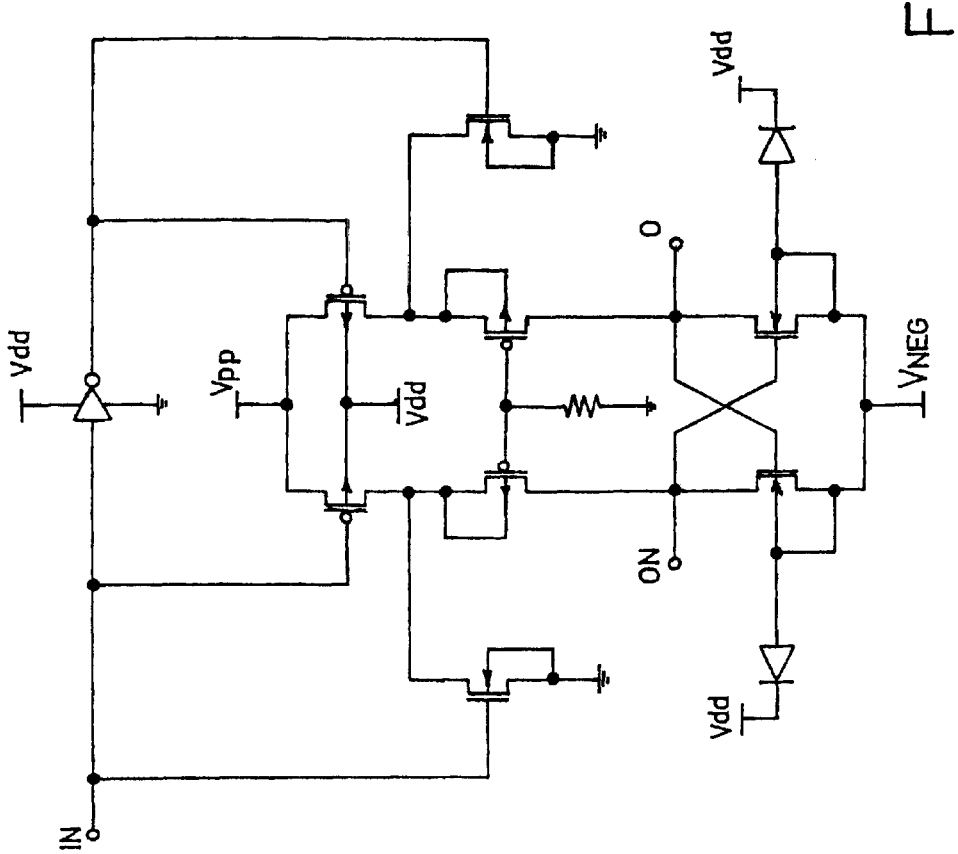
FIGS. 5 and 6 show the electrical diagram of high voltage switches of positive and negative type, respectively.
Figure 5:
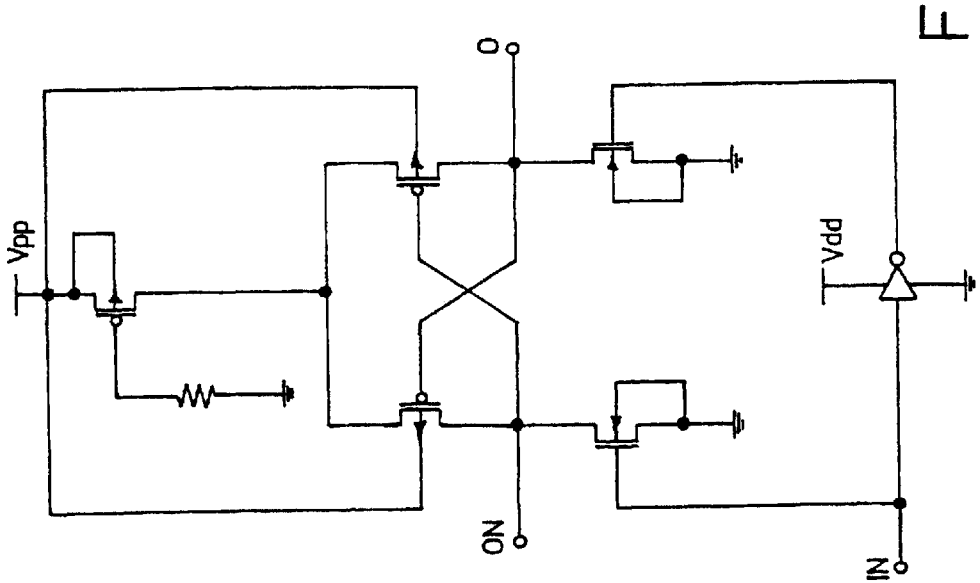

The HVS stages 27.0 and 27.1, which in practice form the row decoders 24 of FIG. 7, have the function of suitably transferring the modification voltages $V_E$ and $V_B$, the supply voltage $V_{dd}$, and the ground potential to the biasing lines 28–32, according to the selected sector row (and hence according to the logic value of the address signals X<0> and X<1>) and according to the operation to be performed (and hence according to the value of the mode signal P/E). In particular, the HVS stages 27.0 and 27.1 supply the modification voltages $V_E$ and $V_B$ to only the biasing lines 28, 29 and 32 connected to the sector which each time is to be erased or written, as explained hereinafter, and comprise high voltage analog switches of the type shown in FIGS. 5 and 6 according to the polarity of the voltage to be transferred, and an appropriate logic for controlling the high voltage analog switches themselves.

Figure 9:
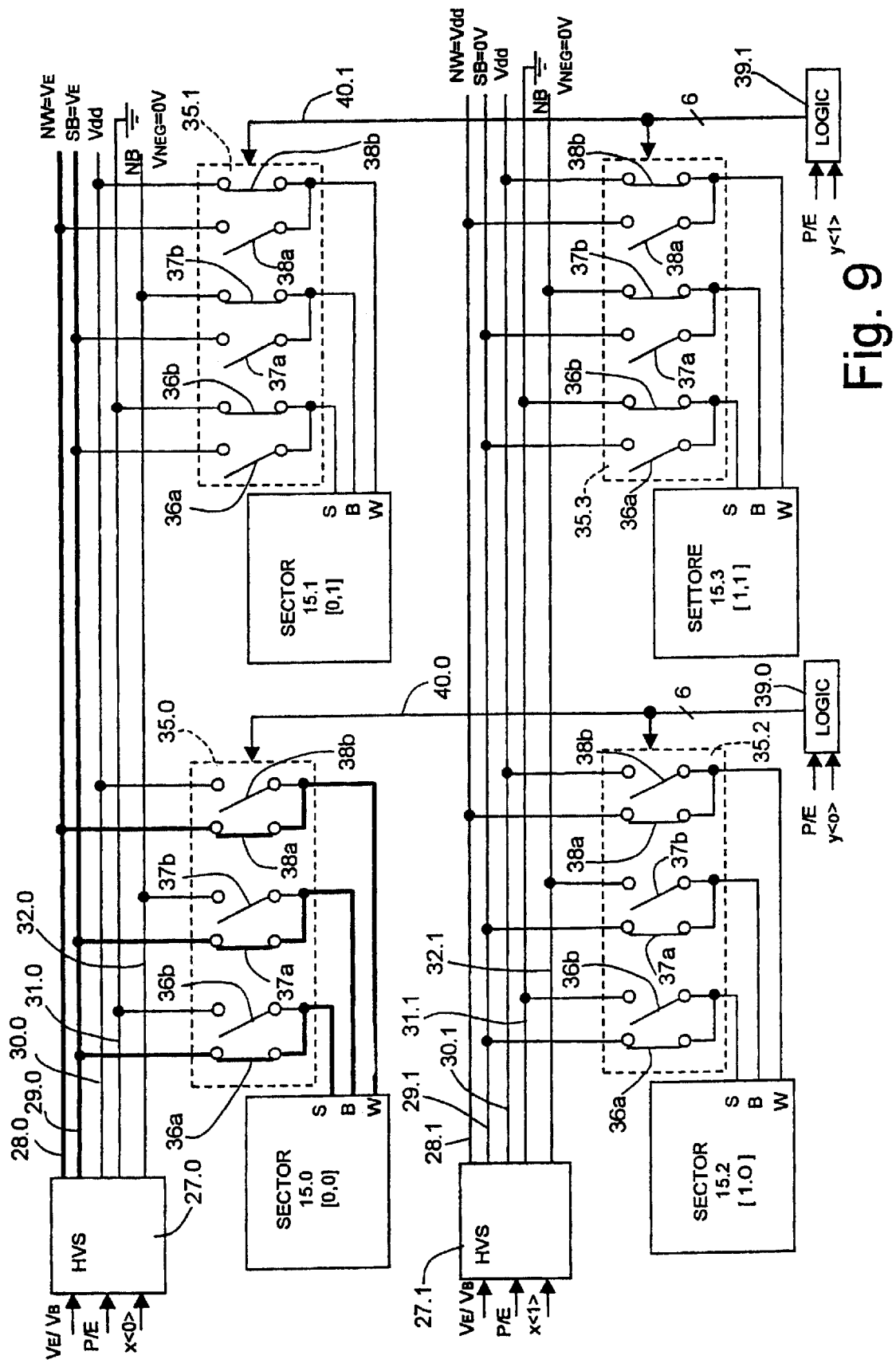
Figure 10:
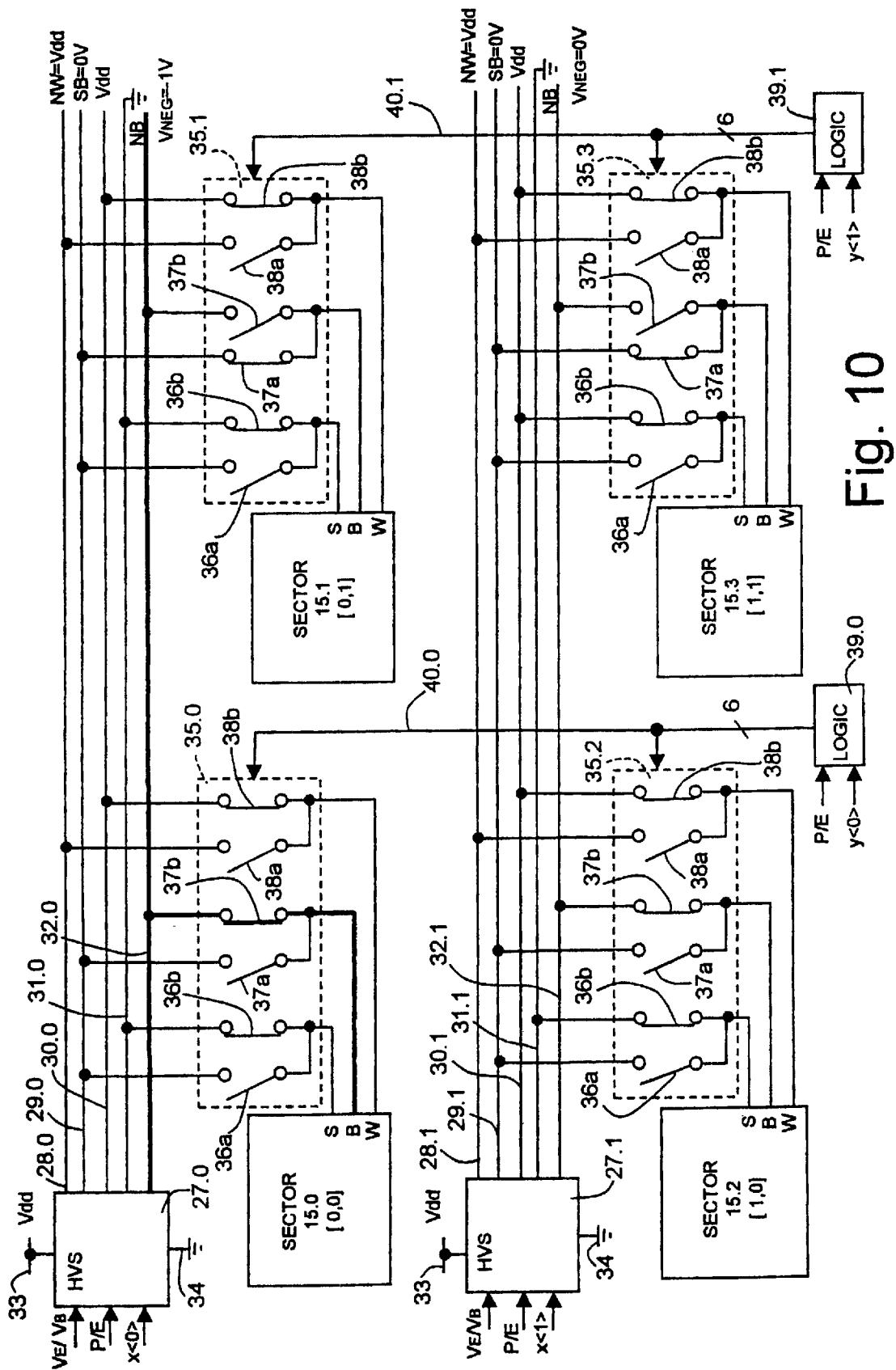

The control logic stages 39.0 and 39.1, which in practice form the column decoders 25 of FIG. 7, have the function of suitably controlling the sector switching stages 35.0–35.3 according to the addressed sector column (and hence according to the logic value of the address signals Y<0> and Y<1>) and according to the operation to be performed (and hence according to the value of the mode signal P/E) so as to suitably connect the biasing lines 28–32 to the switches 36a-38b, as explained in detail hereinafter, assuming that a read, erase, or write operation is to be performed, with reference to FIGS. 8, 9 and 10, respectively. In the same way as for the HVS stages, the control logic stages 39 comprise high voltage analog switches and an appropriate control logic.

In all the operations, the sector supply line 30 is always set at $V_{dd}$, and the ground line 31 is always connected to 0 V.

Reading (FIG. 8)

During reading all the sectors 15.0–15.3 receive identical biasing voltages for biasing the terminals S, B, N. Consequently, the NW lines 28.0, 28.1 are here biased to $V_{dd}$ (NW=$V_{dd}$); the SB lines 29.0, 29.1 are grounded (SB=0 V); and the NB lines 32.0, 32.1 are grounded ($V_{NEG}$=0 V).

In addition, the control logic stages 39.0 and 39.1 generate control signals such as to keep all switches 36a, 37a and 38a open and to keep all switches 36b, 37b and 38b closed. Consequently, all the sectors 15.0–15.1 have their source terminals S connected to ground, their isolated well terminals B set at 0 V, and their N-well terminals W set at $V_{dd}$.

Erasing of sector 15.0 having addresses X<0> and Y<0> (FIG. 9)

The HVS stage 27.0 (corresponding to the first sector row) connects the NW line 28.0 and the SB line 29.0 to positive erasing voltage $V_E$ (NW, SB=$V_E$=5.8 V), and grounds the NB line 32.0 ($V_{NEG}$=0 V). The HVS stage 27.1 (corresponding to the second sector row) connects the NW line 28.1 to the supply voltage $V_{dd}$, and grounds the SB line 29.1 and the NB line 32.1 SB, $V_{NEG}$=0 V.

In addition, the control logic stage 39.0 generates control signals such as to keep switches 36a, 37a and 38a closed and to keep switches 36b, 37b and 38b of sector switching stages 35.0 and 35.2 open, and the control logic stage 39.1 generates control signals such as to keep switches 36b, 37b and 38b closed, and to keep switches 36a, 37a and 38a of sector switching stages 35.1 and 35.3 open.

Consequently, as is shown in FIG. 9 by thick lines which indicate the modification voltage lines, only the source terminal S, the isolated well terminal B and the N-well terminal W of the sector 15.0 receive the positive erasing voltage $V_E$.

The sector 15.1, associated to the same biasing lines 28.0–30.0 of the addressed sector 15.0, has its source terminal S and its N-well terminal W grounded, and its isolated well terminal B set at $V_{dd}$.

The sector switching stage 35.2 of sector 15.2 is controlled by the same control signals as the sector switching stage 35.0 associated to the addressed sector 15.0; thus sector 15.2 has its source terminal S, its isolated well terminal B, and its N-well terminal W biased as sector 15.1, given the voltages present on the biasing lines 28.1–29.1.

The sector 15.3, which is neither arranged on the same row nor on the same column as the addressed sector 15.0, is biased as sectors 15.1 and 15.2.

In this way, only the sector that is to be erased receives the modification voltages.

Programming of sector 15.0 having addresses X<0> and Y<0> (FIG. 10)

The HVS stage 27.0 (corresponding to the first sector row) connects the NW line 28.0 to the supply voltage (NW=$V_{dd}$), the SB line 29.0 to ground (SB=0 V), and the NB line 32.0 to a negative potential ($V_{NEG}$=–1 V). The HVS stage 27.1 (corresponding to the second sector row) connects the NW line 28.1 to the supply voltage (NW=$V_{dd}$), and grounds the SB line 29.1 and the NB line 32.1 (SB, $V_{NEG}$=0 V).

In addition, the control logic stage 39.0 generates control signals such as to keep switches 36b, 37b and 38b closed and to keep switches 36a, 37a and 38a of sector switching stages 35.0 and 35.2 open, and the control logic 39.1 generates control signals such as to keep switches 36b, 37a and 38b closed, and to keep switches 36a, 37b and 38a of sector switching stages 35.1 and 35.3 open.

Consequently, as is shown in FIG. 10 by thick lines which indicate the modification voltage lines, only the isolated well terminal B of the sector 15.0 receives the negative voltage $V_{NEG}$.

The sector 15.1, associated to the same NB line 32.0 as the addressed sector 15.0, has its isolated well terminal B set at 0 V in order to prevent stresses.

The sector switching stage 35.2 of sector 15.2 is controlled by the same control signals as the sector switching stage 35.0 associated to the addressed sector 15.0; thus sector 15.2 has its isolated well terminal B grounded, given the voltage present on the NB line 32.1.

The sector 15.3, which is neither arranged on the same row nor on the same column as the addressed sector 15.0, is biased as sectors 15.1 and 15.2.

In this way, only the sector that contains the cell to be programmed receives the negative voltage on the isolated well terminal B.

Figure 11:
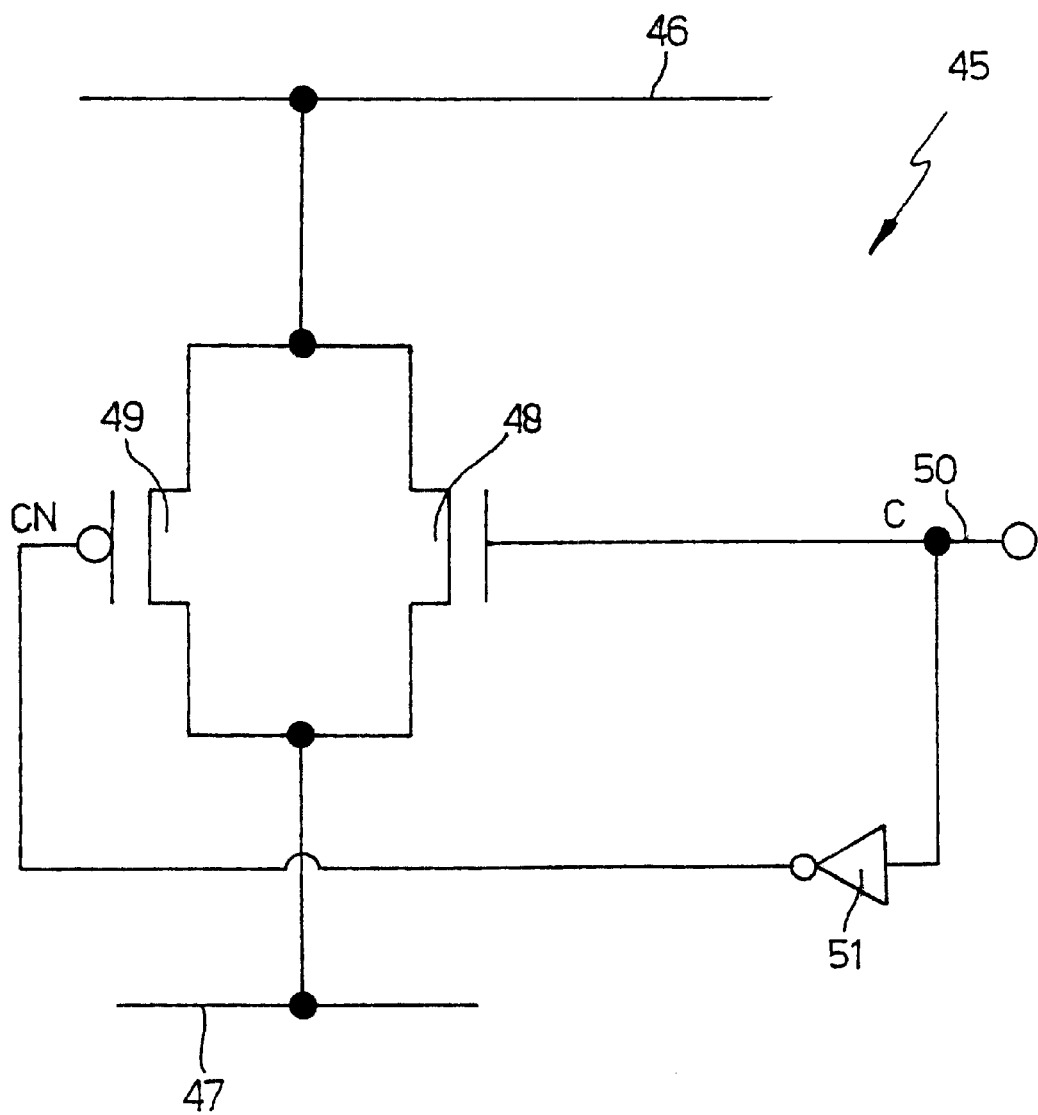
FIG. 11 shows the electrical diagram of a CMOS switch.

In FIGS. 8–10, the switches 36b (which are always connected between ground and the source terminal) and the switches 38b (which are always connected between the supply and the N-well terminal W) can be made using pass transistors of an appropriate type (NMOS and, respectively, PMOS); instead, the switches 36a, 37a, 37b, and 38a are arranged between lines biased at different voltages according to whether the respective sector is or is not selected (for example, with reference to FIG. 9, during erasing switch 36a of sector switching stage 35.0 must transfer a high positive voltage $V_E$, whilst switch 36a of sector switching stage 35.2 must transfer the ground potential). The switches 36a, 37a, 37b, and 38a are thus advantageously made as CMOS pass gates 45, as shown in FIG. 11.

In detail, the sector switch 45 is arranged between an input line 46 and an output line 47 to transfer the potential on the input line 46 to the output line 47. The sector switch 45 comprises an NMOS transistor 48 and a PMOS transistor 49 having first terminals connected together and to the input line 46, and second terminals connected together and to the output line 47.

The gate terminal of NMOS transistor 48 is connected to a control input 50 fed with a control signal C switchable between two logic levels corresponding to the voltage values that may occur on the input line 47 (for example, in the case of the switch 36a considered previously, the control signal C is switchable between $V_E$ and 0 V). The control input 50 is moreover connected to the gate terminal of the PMOS transistor 49 via an inverter 51 so as to receive the complementary signal CN.

The sector switch 45 is able to transfer the voltage present on the input line 46 to the output line 47 in the presence of a high logic level of the control signal C. In fact, when on the input line 46 a high modification voltage is present ($V_E$, in the case considered above), and the control signal C also has the value of $V_E$, the NMOS transistor 48 is off, but the PMOS transistor 49 (receiving the complementary signal CN at 0 V) is on; instead, when the ground potential (0 V) is present on the input line 46, the NMOS transistor 48 is on. On the other hand, when the switch 45 must be open, notwithstanding the presence of the high voltage on the input line 46, the signal C is low and keeps the NMOS transistor 48 off, and the complementary signal CN is set at the high modification voltage, so maintaining a zero voltage drop between the source terminal and gate terminal of the PMOS transistor 49, which is thus certainly off.

The advantages of the memory device described are the following: first, it reduces the number of decoding components, in particular the number of high voltage switches. In fact, in the above considered case of 64 sectors, arranged in eight rows and eight columns, the present solution requires 8×2=16 positive switches and 8 negative switches inside the HVS stages (27.0 and 27.1 in FIGS. 8–10) to control the pass transistors that connect the $V_E/V_B$ input lines to the biasing lines (28.0, 28.1, 29.0, 29.1, 32.0, and 32.1 in the example of FIGS. 8–10); 24 high positive voltage switches and 8 negative switches in the control logic stages (39.0 and 39.1 in FIGS. 8–10) for the signals (C, CN in FIG. 11) for controlling the switches 36a, 36b, 37a, 37b, 38a, and 38b. Altogether, therefore, the present solution requires 56 high voltage switches, as compared to 256 switches necessary in the case discussed previously according to the prior art.

In practice, a bulk reduction and an architectural simplification are obtained as compared to the known solutions. This has a considerable impact on the costs of the device, in particular in the case of large size memories.

A further saving is obtained by virtue of a more compact layout of the biasing lines and the generation of a lower number of control signals. This is particularly useful in the case of triple well CMOS technologies, where three global terminals per sector must be controlled instead of one global terminal as in single well arrays, without the invention being limited to the case of triple well devices.

The present solution does not require the availability of special signals for addressing the sector rows and columns (signals X and Y in FIGS. 7–10). In fact, in the hierarchical management of cell rows and columns of a memory array of a known type, signals are already available for selectively enabling the rows and the columns of the array. In particular, row decoder circuits and column decoder circuits are already present, which, starting from the bit vector constituting the address of a cell to be selected, suitably bias the rows and columns of the array. Usually, therefore (for example at the pre-decoding level), logic signals are already available, which identify the group to which the row and the column of the memory cell addressed belong, and these groups generally correspond to adjacent columns or rows, and hence can be gathered together in such a way that each group of columns or rows of cells refers to a same sector column or row.

Instead, the partial re-use of the decoding signals reduces the number of logic circuits to be implemented.

According to an aspect of the present invention, the switching stages 35 are made so as to prevent any risk of latch-up phenomena (i.e., undesired turning-on of parasitic components).

Figure 12:
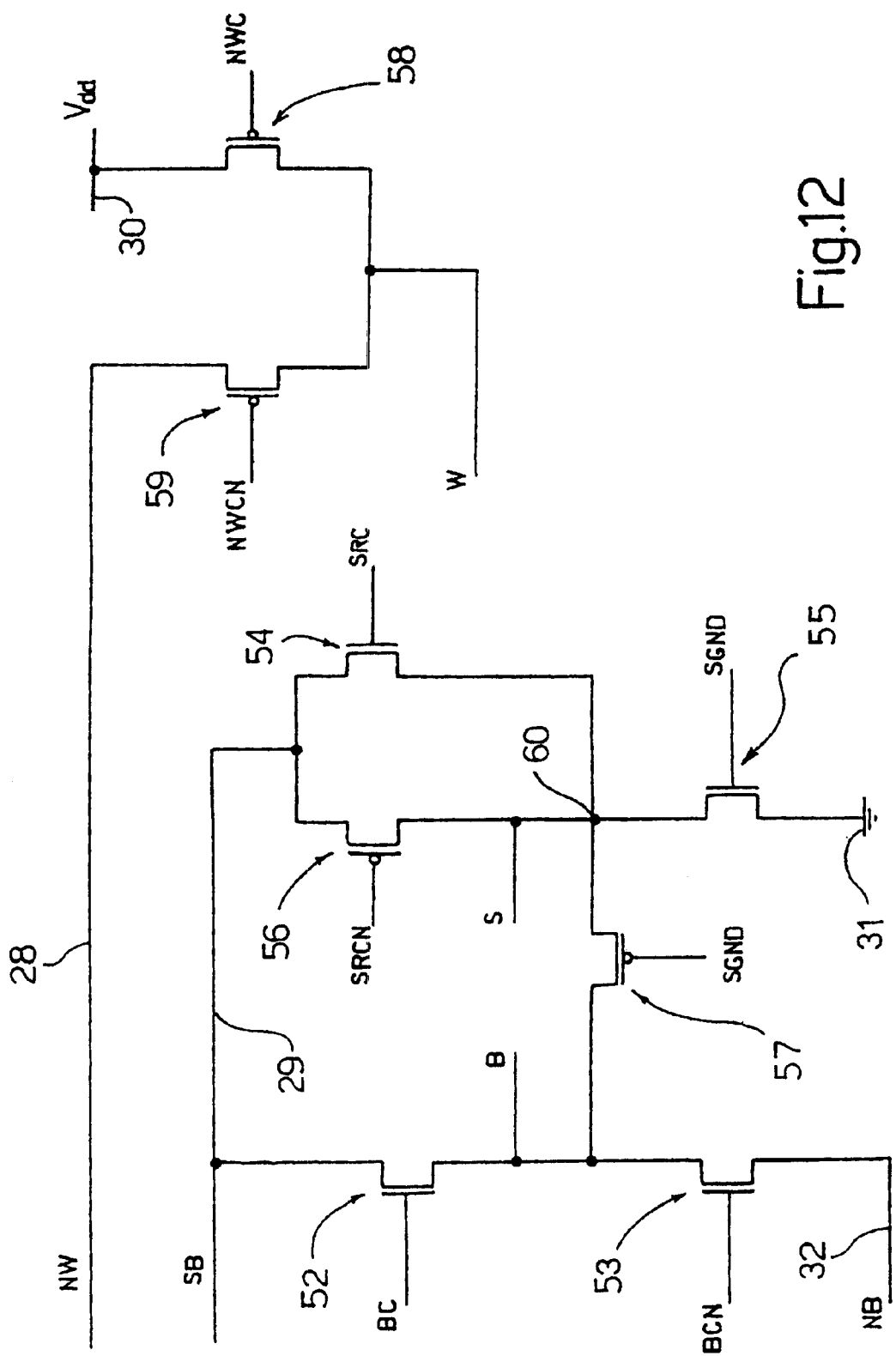
FIG. 12 shows the electric diagram of a detail of FIGS. 8–10, according to an aspect of the invention.

For this purpose, as shown in FIG. 12, each switching stage 35 comprises a first, second, third, and fourth NMOS transistor 52, 53, 54, and 55, and a first, second, third, and fourth PMOS transistor 56, 57, 58, and 59.

In particular, the first and the second NMOS transistors 52, 53 implement he pair of complementary switches 37a, 37b of FIGS. 8–10; the second and the third NMOS transistors 54, 55 and the first PMOS transistor 56 implement the pair of complementary switches 36a, 36b, and the third and fourth PMOS transistors 58 and 59 implement the pair of complementary switches 38a, 38b. The second PMOS transistor 57 connects together the pairs of complementary switches 36a, 36b and 37a, 37b, for the reasons explained hereinafter. Unlike the switching stages 35 of FIG. 11, each transistor 52–59 receives seven control signals from the respective control logic stage (FIGS. 8–10), as is described hereinafter.

In detail, the first NMOS transistor 52 has a first terminal connected to the line SB 29, a second terminal connected to the isolated well terminal B, and a gate terminal receiving a first control signal BC.

The second NMOS transistor 53 has a first terminal connected to the isolated well terminal B, a second terminal connected to the line NB 32, and a gate terminal receiving a second control signal BCN, which is inverted with respect to the first control signal BC.

The third NMOS transistor 54 has a first terminal connected to the line SB 29, a second terminal connected to a node 60 (connected to the source terminal S), and a gate terminal receiving a third control signal SRC.

The fourth NMOS transistor 55 has a first terminal connected to the node 60, a second terminal connected to the ground line 31, and a control terminal receiving a fourth control signal SGND.

The first PMOS transistor 56 has a first terminal connected to the node 60, a second terminal connected to the line SB 29, and a gate terminal receiving a fifth control signal SRCN, which is inverted with respect to the third control signal SRC.

The second PMOS transistor 57 is connected with its first and second terminals between the node 60 and the isolated well terminal B, and has a gate terminal receiving the fourth control signal SGND.

The third PMOS transistor 58 has a first terminal connected to the sector supply line 30, a second terminal connected to the N-well terminal W, and a gate terminal receiving a sixth control signal NWC.

The fourth PMOS transistor 59 has a first terminal connected to the line NW 28, a second terminal connected to the N-well terminal W, and a gate terminal receiving a seventh control signal NWC, which is inverted with respect to the sixth control signal NWCN.

The PMOS transistors 56–59 are advantageously high voltage ones, and can therefore be driven at a high voltage. The NMOS transistors 52–54 are drain extension ones, so as to be operative at high voltages. Finally, the fourth NMOS transistor 55 is standard, and thus more conductive than NMOS transistors 52–54, so as to be able to conduct a high current, as is required during reading and programming, and discharge to ground the high current supplied by the cells of the addressed sector. It is in any case turned off before its drain terminal (connected to the source node S) is charged to high voltage during erasure, in order to prevent breakdown.

As described for signals S0 and S1 of FIG. 8, the control signals BC, BCN, SRC, SGND, SRCN, NWC, and NWCN are transferred to each switching stage 35 by the respective control logic stage 39.0 and 39.1, and their logic value is the same for all the sectors arranged on a same sector column. The control signals BC, BCN, SRC, SGND, SRCN, NWC, and NWCN have voltage values such as to enable turning-on or turning-off of the respective transistors in the different operating conditions of the memory device 20. In particular, the first control signal BC and the second control signal BCN have a low logic level, equal to the voltage present on the line NB 32, and a high logic level, equal to the supply voltage $V_{dd}$.

The third control signal SRC and the fifth control signal SRCN have a low logic level of 0 V, and a high logic level equal to the voltage present on line NW 28.

The fourth control signal SGND has a low logic level of 0 V, and a high logic level, equal to the supply voltage $V_{dd}$.

The sixth control signal NWC and the seventh control signal NWCN have a low logic level, equal to 0 V, and a high logic level, equal to the voltage present on line NW 28.

Reading

During reading, as previously described, line NW 28 is at supply voltage $V_{dd}$, and lines SB 29 and NB 32 are connected to ground (SB=NB=$V_{NEG}$=0 V).

In this phase, the second, fourth, fifth and seventh control signals BCN, SGND, SRCN, and NWCN are at a high logic level, whilst the first, third and sixth control signals BC, SRC and NWC are at a low logic level, as shown in Table 2 below.

TABLE 2

| BC | BCN | SRC | SGND | SRCN | NWC | NWCN |
|---|---|---|---|---|---|---|
| 0V | $V_{dd}$ | 0 | $V_{dd}$ | $V_{dd}$ | 0V | $V_{dd}$ |

Consequently, the first NMOS transistor 52 is off, and the second NMOS transistor 53 is on and brings the voltage of the isolated well terminal B to the voltage of the line NB 32 (B=NB=$V_{NEG}$=0 V). The third NMOS transistor 54, and the first and second PMOS transistors 56, 57 are off, and the fourth NMOS transistor 55 is on and grounds the source terminal S (S=0 V).

The third PMOS transistor 58 is on, and the fourth PMOS transistor 59 is off, so that the voltage of the N-well terminal W is equal to the voltage present on supply line 30 (W=$V_{dd}$).

Erasing of sector 15.0 having address X<0> and Y<0>

Analogously to the above, line NW 28.0 and line SB 29.0 are set at the positive erase voltage $V_E$ (NW, SB=$V_E$=5–8 V); line NB 32.0 is at ground voltage (NB=$V_{NEG}$=0 V); line NW 28.1 is set at the supply voltage $V_{dd}$; and lines SB 29.1 and NB 32.1 are set at ground voltage (SB=NB=$V_{NEG}$=0 V).

The control logic signals BC, BCN, SRC, SGND, SRCN, NWC, and NWCN have values for the first column that are different from the values for the second column. In addition, at the end of erasing, they are controlled according to a preset sequence so as to prevent undesired biasing.

In detail, during the proper erasing phase (charging), for the first (addressed) column the first control signal BC is high; the second control signal BCN is low; the third control signal SRC is high; the fourth control signal SGND is low; the fifth control signal SRCN is low; the sixth control signal NWCN is high; and the seventh control signal NWCN is low. For the second column, the control signals BC, BCN, SRC, SGND, SRCN, NWC, and NWCN have the same values as those assumed during reading.

TABLE 3

|  | BC | BCN | SRC | SGND | SRCN | NWC | NWCN |
|---|---|---|---|---|---|---|---|
| 35.0, 35.2 (charge step) | $V_{dd}$ | 0V | $V_E$ | 0V | 0V | $V_E$ | 0V |
| 35.0, 35.2 (1st discharge step) | $V_{dd}$ | 0V | 0V | 0V | $V_{dd}$ | 0V | $V_{dd}$ |
| 35.0, 35.2 (2nd discharge step) | 0V | $V_{dd}$ | 0V | $V_{dd}$ | $V_{dd}$ | 0V | $V_{dd}$ |
| 35.1, 35.3 | 0V | $V_{dd}$ | 0V | $V_{dd}$ | $V_{dd}$ | 0V | $V_{dd}$ |

Consequently, in the switching stage 35.0 associated to the addressed sector 15.0 (to be erased) the third PMOS transistor 58 is off, and the fourth PMOS transistor 59 is on and brings the N-well terminal W to the voltage present on line NW 28.0 (W=NW=$V_E$=8 V).

The second NMOS transistor 53 and the fourth NMOS transistor 55 are off; the third NMOS transistor 54 and the first PMOS transistor 56 are on and bring the source terminal S to the voltage present on line SB 29.0 (S=SB=8 V).

The second PMOS transistor 57 and the first NMOS transistor 52 are off and, in a first phase, tend to bring the isolated well terminal B to the voltage present on line SB, i.e., to 8 V. In particular, when the isolated well terminal B reaches a voltage equal to the difference between the supply voltage $V_{dd}$ and the threshold voltage of the first NMOS transistor 52, the latter turns off. In this first phase, the third NMOS transistor 54 and the first PMOS transistor 56 are controlled with voltages higher than the one controlling the first NMOS transistor 52 (the first PMOS transistor 56 receives a source-to-gate voltage equal to $V_E$, while the first NMOS transistor 52 receives a source-to-gate voltage equal to $V_{dd}$); the NMOS transistor 54 and PMOS transistor 56 carry a higher current, and the common source terminal S charges more rapidly than does the isolated well terminal B.

Subsequently (upon turning-off of the first NMOS transistor 52), the isolated well terminal B is kept connected to the line SB 28 via the network formed by the first and second PMOS transistors 56, 57 and the third NMOS transistor 54. In this way, a voltage drop (decreasing progressively as the source terminal S is charged) across the second PMOS transistor 57 ensures that the voltage at the isolated well B is lower than the voltage at the source terminal S. When the source terminal S reaches the voltage present on line SB (S=SB=8 V), the voltage drop across the second PMOS transistor 57 substantially becomes equal to 0 V, and consequently the isolated well terminal B reaches the voltage of line SB (B=SB=8 V).

In this phase, the transistors 52–59 of the switching stage 35.2 receive the same control signals BC, BCN, SRC, SGND, NWC, and NWCN as the switching stage 35.0. Consequently, the switching stage 35.2 has the first and third NMOS transistors 52, 54, and the second and fourth PMOS transistors 57, 59 on, and all the other transistors off. In particular, the connection between the source terminal S and grounded line 32 is obtained by turning-on the third NMOS transistor 54.

In this way, the N-well terminal W has the voltage of line NW 28.1 (W=NW=$V_{dd}$), the source terminal S is brought to the voltage of line SB 29.1 (S=SB=0 V), and the isolated well terminal B is brought to the voltage of line SB 29.1 (B=SB=0 V). The sector 35.2 is thus not erased.

At the end of erasing, the nodes previously brought to a high voltage (isolated well terminal B and source terminal S) must be discharged. For this purpose, line NW 28.0 is biased at $V_{dd}$ (NW=$V_{dd}$). Line SB 29.0 and NB 32.0 are grounded (SB=NB=0 V). During discharge, two steps are present, in both of which the voltage of the control signals BC, BCN, SRC, SGND, SRCN, NWC, and NWCN in the high state is equal to the supply voltage $V_{dd}$, and in the low state is equal to 0 V.

In a first step, the first, fifth and seventh control signals BC, SRCN, and NWCN are brought to the high logic level; the second, third, fourth and sixth control signals BCN, SRC, SGND, and NWC are brought to the low logic level.

In this condition, the second, third, and fourth NMOS transistors 53, 54 and 55, as well as the first PMOS transistor 56, are off. The first NMOS transistor 52 turns on and connects the isolated well terminal B to line SB 29, and thus discharges the isolated well terminal B to ground. In addition, the third PMOS transistor 58 is on, and the fourth PMOS transistor 59 is off.

The second PMOS transistor 57 is on and connects the source terminal S to the isolated well terminal B, causing discharge of the source terminal S to ground, with a slight delay with respect to the isolated well terminal B. In detail, the voltage drop present between the source terminal and drain terminal of the second PMOS transistor 57 ensures that the isolated well region 11.0 (FIG. 3), which is P type, is constantly kept at a lower voltage than the source region S (FIG. 2), which is N type, and consequently does not generate direct biasing on the source/body junction, and thus undesired current flow.

In a second step, after the source terminal S and the isolated well terminal B are definitely discharged, the first control signal BC is brought to a low logic level, and consequently the first NMOS transistor 52 is off and the second NMOS transistor 53 is on. In addition, the fourth control signal SGND is brought to a high logic level, thus determining turning-off of the second PMOS transistor 57 (with the consequent interruption of the connection between the isolated well terminal B and the source terminal S) and turning-on of the fourth NMOS transistor 55. In this way, the isolated well terminal B is connected to line NB (B=NB=0 V), and the source terminal S is grounded 31 (S=0 V). The switching stage 35.0 is thus in a reading condition.

In the two discharging steps, the switching stage 35.2 has the same switching sequence as the transistors of the stage 35.0, without, however, causing any discharging, given that previously no high voltage was present.

During erasing, the control signals BC, BCN, SRC, SGND, SRCN, NWC, and NWCN supplied to the second (not addressed) column are at the same logic level as during reading. In particular, the switching stages 35.1 and 35.3 have the second and fourth NMOS transistors 53, 55 and the third PMOS transistor 58 on, and all the other transistors off. In this way, the isolated well terminals B and source terminals S of the sectors 35.1 and 35.3 are connected, respectively, to line 32.0 (set at 0 V) and to ground line 31, and are isolated from lines NW 28.0 and SB 29.0. The N-well terminal W is thus biased at the supply voltage $V_{dd}$.

Figure 13:
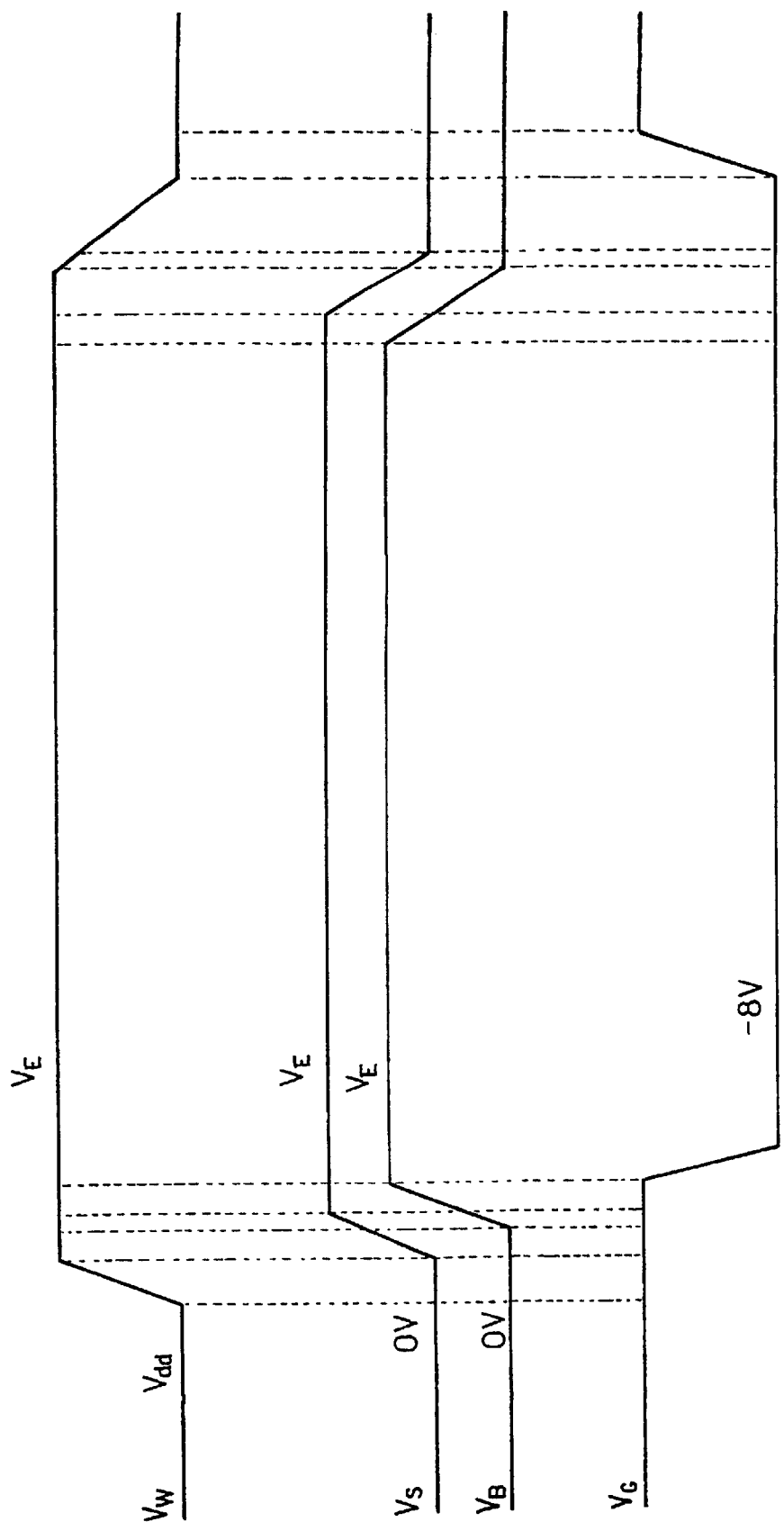
FIG. 13 shows the plot of voltages of the circuit of FIG. 12, in an operating condition.

The plot of the voltages supplied to the N-well terminal W (voltage $V_w$), to the source terminal S (voltage $V_s$), to the isolated well terminal B (voltage $V_B$), and to the gate terminal G (voltage $V_G$) of the addressed cells during erasing is shown in FIG. 13.

Consequently, the sectors 35.1, 35.2 and 35.3 are not affected by erasing and remain in a reading condition.

Programming of sector 15.0 having address X<0> and Y<0>

Analogously to the above, line 28.0 is set at the supply voltage (NW=$V_{dd}$), line SB 29.0 at ground voltage (SB=0 V), and line NB 32.0 at a negative voltage (NB=$V_{NEG}$=−1 V). In addition, the line NW 28.1 is set at the supply voltage (NW=$V_{dd}$). The line SB 29.1 and the line NB 32.1 are at ground voltage (SB=NB=$V_{NEG}$=0 V).

The control logic signals BC, BCN, SRC, SGND, SRCN, NWC, and NWCN have values for the first column that are different from the values for the second column.

In detail, the second, fourth, fifth and seventh control signals BCN, SGND, SRCN, and NWCN of the first (addressed) column are at a high logic level; the first, third and sixth control signals BC, SRC, NWC are at a low logic level, as indicated in Table 4 below.

TABLE 4

|  | BC | BCN | SRC | SGND | SRCN | NWC | NWCN |
|---|---|---|---|---|---|---|---|
| 35.0, 35.2 | $V_{NEG}$ | $V_{dd}$ | $V_E$ | $V_{dd}$ | $V_{dd}$ | 0V | $V_{dd}$ |
| 35.1, 35.3 | $V_{dd}$ | $V_{NEG}$ | 0V | $V_{dd}$ | $V_{dd}$ | 0V | $V_{dd}$ |

Consequently, the second NMOS transistor 53 is on, and the first NMOS transistor 52 is off. The second NMOS transistor 53 forces the voltage of the isolated well terminal B to be equal to the voltage present on line NB 32 (B=NB= $V_{NEG}$=−1 V). The source terminal S is grounded, and the N-well terminal W is connected to the supply voltage $V_{dd}$.

Since also in this step the NMOS and PMOS transistors 52–59 of the switching stage 35.2 are in the same operating state as the NMOS and PMOS transistors 52–59 of the switching stage 35.0, the isolated well terminal B of the sector 15.2 is biased at the voltage present on line NB 32.1 (B=NB=$V_{NEG}$=0 V), the source terminal S is grounded, and the N-well terminal W is connected to the supply voltage $V_{dd}$.

During programming, the second control signal BCN supplied to the second (not addressed) column is at a low logic level and controls switching-off of the second NMOS transistor 53, and the first control signal BC is at a high logic level and controls switching-on of the first NMOS transistor 52, thus biasing the isolated well terminals B of the sectors 15.1 and 15.3 to the voltage present on lines SB 29.0 and 29.1 (B=SB=0 V). In addition, analogously to the switching stages 35.0, 35.2, the source terminals S of the sectors 15.1 and 15.3 are grounded, and the N-well terminals W are biased to the supply voltage $V_{dd}$.

From the above, it is evident that the switching stage 35 illustrated in FIG. 12 eliminates any possible problems of parasitic currents caused by undesired direct biasing between the junctions connected to the biased terminals, albeit using a small number of transistors and thus occupying a very small area.

In the most critical phases (charging and discharging during erasing of the sector addressed), the isolated well B is constantly kept at a lower voltage than the source terminal S. In particular, in the transition from reading to erasing of a sector 15, the second transistor 57 connects the isolated well terminal B to the source terminal S, thus ensuring that the isolated well terminal B reach the erasing voltage after the source terminal S, thus preventing direct biasing of the junction between the two regions (i.e., source region and body well region).

In addition, in the transition from erasing to reading (first discharging step), the first NMOS transistor 52 and the second PMOS transistor 57 ensure that the isolated well terminal B reaches 0 V before the source terminal S, thus also in this case eliminating any risk of direct biasing.

Finally, it is clear that numerous modifications and variations may be made to the memory device described and illustrated herein, all falling within the scope of the invention, as defined in the attached claims.

What is claimed is:

1. A memory device comprising:

a plurality of memory sectors each including a plurality of memory cells; and hierarchical sector decoding means wherein said memory sectors are mutually aligned, the decoding means comprising:

a plurality of switching stages each connected to a respective memory sector and each having a respective control input;

a plurality of groups of biasing lines extending parallel, each group of biasing lines being connected to switching stages connected to memory sectors mutually aligned; and a plurality of groups of control lines extending parallel; each group of control lines being connected to said control inputs of switching stages connected to memory sectors mutually aligned.

2. The memory device according to claim 1, wherein the decoding means further comprises a plurality of decoding stages, said decoding stages being connected between reference potential lines and a respective group of biasing lines, and a plurality of control logic circuits, said control logic circuits being connected each to a respective one of the groups of control lines.

3. The memory device according to claim 2, wherein said decoding stages each have a respective address input and a respective mode input selectively connecting said reference potential lines to said respective group of biasing lines according to signals present on said respective address and mode inputs, wherein said control logic circuits each have a respective address input and a respective mode input, and are connected to said reference potential lines selectively connecting said reference potential lines to said respective group of control lines according to signals present on said respective address and mode inputs.

4. The memory device according to claim 2, wherein said switching stages comprise pass transistors.

5. The memory device according to claim 4, wherein at least some of said pass transistors are CMOS pass gates.

6. The memory device according to claim 1, wherein said memory sectors each comprise a common source terminal, and said biasing lines comprise at least one source modification voltage line connected to said common source terminal through a respective sector switch belonging to a respective switching stage.

7. The memory device according to claim 1, wherein said memory sectors have a triple well structure and each comprise a common source terminal, an isolated well terminal, and an external well; each of said groups of biasing lines comprises at least a source and body modification voltage line, a well voltage modification line, and a negative biasing line; said source and body modification voltage line being selectively connectable to said common source terminal and to said isolated well terminal through respective sector switches belonging to a respective switching stage, said well voltage modification line being selectively connectable to said external well terminal through a respective sector switch belonging to a respective switching stage; and said negative biasing line being selectively connectable to said isolated well terminal through respective sector switches belonging to a respective switching stage.

8. The memory device according to claim 7, wherein said sector switches comprise pairs of complementary switches.

9. The memory device according to claim 7, wherein each of said switching stages comprises an electric connection element connected between said common source and isolated well terminals to connect said common source and isolated well terminals together during erasing.

10. The memory device according to claim 9, wherein said electric connection element comprises a first MOS transistor having a first and a second conduction terminals connected, respectively, to said common source terminal and said isolated well terminal, and a control terminal receiving a control signal.

11. The memory device according to claim 10, wherein each of said switching stages comprises a second MOS transistor connected between said common source terminal and a reference potential line.

12. The memory device according to claim 7, wherein each of said first sector switches comprises a CMOS switch; and said second, third, and fourth sector switches each comprise, respectively, a third, fourth, and fifth MOS transistor.

13. The memory device according to claim 12, wherein said third and fifth MOS transistors receive opposite-phase control signals.

14. The memory device according to claim 12, wherein each of said switching stages further comprises a sixth MOS transistor connected between a supply line and said external well terminal.

15. In a memory device comprising a plurality of memory sectors each comprising a plurality of memory cells, said memory sectors being mutually aligned, a plurality of groups of biasing lines extending parallel, a biasing method comprising:
  sending modification voltages to at least one selected group of said groups of biasing lines; and
  connecting said memory sectors to said groups of biasing lines.

16. The method according to claim 15, further comprising sending de-selection voltages to non-selected groups of said groups of biasing lines.

17. The method according to claim 15, wherein said memory sectors each comprise a common source terminal, and said step of sending modification voltages comprises sending a source modification voltage to said common source terminal.

18. The method according to claim 15, wherein said memory sectors have a triple well structure and each comprise a common source terminal, an isolated well terminal and an external well terminal, wherein said step of sending modification voltages comprises, selectively, at least one of the steps of:
  sending a source modification voltage to said common source terminal;
  sending a body modification voltage to said isolated well terminal; and
  sending a well modification voltage to said external well.

19. The method according to claim 18, comprising an erasing phase including the steps of supplying said source modify voltage to said common source terminal and said isolated well terminal; and biasing said common source terminal at a higher speed with respect to said isolated well terminal.

20. The method according to claim 18, comprising an erasing phase including the steps of supplying said source modify voltage to said common source terminal and said isolated well terminal and of subsequently discharging said common source and isolated well terminals, said discharging step comprising the step of connecting said isolated well terminal to a reference potential line, and connecting said common source terminal to said isolated well terminal to discharge said common source terminal through said isolated well terminal.

21. A memory device, comprising:
  a plurality of memory sectors each comprising a plurality of memory cells, the memory sectors being mutually aligned;
  a plurality of switching stages each connected to a respective one of the memory sectors;
  a plurality of groups of biasing lines extending parallel, each group of biasing lines being connected by a respective set of the switching stages to the memory sectors; and
  a plurality of decoding stages, the decoding stages being connected between reference potential lines and a respective one of the groups of biasing lines.

22. The memory device of claim 21, further comprising:
  a plurality of groups of control lines extending parallel to the second alignment lines; each group of control lines being connected to control inputs of switching stages connected to memory sectors aligned along a respective one of the second alignment lines; and
  a plurality of control logic circuits, one for each of the second alignment lines, the control logic circuits being each connected to a respective one of the groups of control lines.

23. The memory device of claim 21 wherein the decoding stages each have a respective address input and a respective mode input selectively connecting the reference potential lines to the respective group of biasing lines according to signals present on the respective address and mode inputs.

24. The memory device of claim 21 wherein each memory sector includes a common source terminal, and the biasing lines connected to the memory sector comprise at least one source modification voltage line connected to the common source terminal through a respective sector switch belonging to a respective one of the switching stages.

25. The memory device of claim 21 wherein the memory sectors have a triple well structure and each comprise a common source terminal, an isolated well terminal, and an external well; each of the groups of biasing lines comprising a source and body modification voltage line, a well voltage modification line, and a negative biasing line; the source and body modification voltage line being selectively connectable to the common source terminal and to the isolated well terminal through respective sector switches belonging to a respective switching stage, the well voltage modification line being selectively connectable to the external well terminal through a respective sector switch belonging to a respective one of the switching stages; and the negative biasing line being selectively connectable to the isolated well terminal through respective sector switches belonging to the respective switching stage.

* * * * *